United States Patent [19]
Wenzel et al.

[11] Patent Number: 5,635,767
[45] Date of Patent: Jun. 3, 1997

[54] SEMICONDUCTOR DEVICE HAVING BUILT-IN HIGH FREQUENCY BYPASS CAPACITOR

[75] Inventors: James F. Wenzel; Mona A. Chopra, both of Austin; Stephen W. Foster, Dripping Springs, all of Tex.

[73] Assignee: Motorola, Inc., Schaumburg, Ill.

[21] Appl. No.: 460,338

[22] Filed: Jun. 2, 1995

[51] Int. Cl.⁶ .................. H01L 23/52; H01L 23/48; H01L 23/58
[52] U.S. Cl. .................. 257/778; 257/691; 257/692; 257/920
[58] Field of Search .................. 257/778, 691, 257/692, 920

[56] References Cited

U.S. PATENT DOCUMENTS

| 5,089,878 | 2/1992 | Lee | 357/71 |
|---|---|---|---|
| 5,103,283 | 4/1992 | Hite | 357/51 |
| 5,134,247 | 7/1992 | Wehner et al. | 174/52.4 |
| 5,239,448 | 8/1993 | Perkins et al. | 257/778 |
| 5,281,151 | 1/1994 | Arima et al. | 257/778 |

FOREIGN PATENT DOCUMENTS

| 0430544 | 2/1992 | Japan | 257/778 |
|---|---|---|---|

OTHER PUBLICATIONS

Balderes et al., "Glass–Metal Module to Chip Intersection", IBM Technical Disclosure Bulletin vol. 14 No. 11 p. 3224, Apr., 1972

Rucker, et al., "A High Performance SI on SI Multichip Module Technology", 1992 IEEE, 1992 Symposium on VLSI Technology Digest of Technical Papers, pp. 72–73.

*Primary Examiner*—Mashid D. Saadat
*Assistant Examiner*—Valencia Martin Wallace

[57] ABSTRACT

A high frequency bypass capacitor (36, 36') is built into a thin-film portion (16, 16') of a polymer carrier substrate (15) of a PBGA (10). The carrier substrate (15) has both a stiffener (18) and a thin-film portion (16, 16') which has multiple metal layers (24, 28, 30, 32). The power supply planes (28, 30) of these metal layers are used to form built-in bypass capacitors (36, 36'), wherein the power supply planes are specifically designed to be adjacent and parallel layers. An ultra thin film laminate construction provides thin dielectric films (26) between the metal layers to allow the bypass capacitor to be placed very close to the attached semiconductor die (12) to further reduce parasitic inductance and resistance between die connections (14) and the bypass capacitor. The built-in feature minimizes inherent parasitic series inductance and resistance, thus enabling the filtering of unwanted low pulse width glitches on a power plane connected to VLSI devices at operating frequencies at or above 100 MHz.

14 Claims, 2 Drawing Sheets

SEMICONDUCTOR DEVICE HAVING BUILT-IN HIGH FREQUENCY BYPASS CAPACITOR

FIELD OF THE INVENTION

The present invention relates generally to a semiconductor device, and more particularly to a plastic ball grid array (PBGA) semiconductor device having a built-in high frequency bypass capacitor.

BACKGROUND OF THE INVENTION

As the semiconductor technology advances, the devices are becoming more complex and more integrated. The semiconductor devices are being designed with increasing number of inputs/outputs (I/Os), and they are being pushed to operate at much higher frequencies. Having a large number of I/Os necessarily increase the size of the semiconductor die, which is undesirable since miniaturization is also being pushed. Thus, many devices are designed with the I/Os arranged in an area array pattern over the entire active surface of the semiconductor die instead of the traditional arrangement of I/Os around the periphery of the die. By utilizing the entire surface area of the semiconductor die, a larger number of I/Os can be placed on the die without increasing its size. This type of semiconductor die can then be flip-chip mounted directly to a printed circuit (PC) board. Flip-chip technology is well known in the art. However, not all users of these area array semiconductor devices can handle the bare dice without any type of packaging. Thus, these type of semiconductor dice are often packaged by being flip-chip mounted onto a carrier which is typically ceramic. The ceramic carrier has external electrical connections, such as solder balls or pins on its bottom side, for subsequent attachment to the printed circuit board.

Typically, many semiconductor components are mounted on a PC board. These many components are constantly drawing power from a power plane in the printed circuit board. This constant drawing of power creates noise glitches on the $V_{DD}$ line of each device. The pulse widths of these noise glitches can range from tens of pico seconds to hundreds of nano seconds. As the operating speed of a semiconductor device increases, the actual device pulse width decreases. A problem occurs when the noise pulse width approaches the actual device pulse width—a catastrophic failure of the device can occur. Typical Phase Lock Loop (PLL) circuits are extremely sensitive to the small pulse width noise. Thus, a bypass capacitor is required to filter out the noise at high frequencies. Basically, as the frequency of a signal increases and the pulse width decreases, the impedance of the capacitor decreases and the bypass capacitor acts as a short circuit to these high frequency charges. The dissipation of high frequency charge is related to the value of the capacitor and the subsequent parasitic series inductance and series resistor associated with it.

Having recognized the need for a bypass capacitor for the higher frequency device, different approaches have been implemented to provide this capacitor. For a ceramic carrier having a semiconductor die flip-chip mounted thereon, a separate low inductance chip capacitor must be added to the top surface of the ceramic package. These low inductance chip capacitors are very costly and are actually ineffective at pulse widths in the nano second to sub nano second range due to the added inductance of the capacitor as well as the inductance due to the conductive traces that connect the capacitor to the actual die. This methodology also adds complexity and significant cost to the final assembly.

Another approach at providing a bypass capacitor is to build one within the second level PC board, such as a motherboard or a daughter card. The packaged device is then mounted onto the PC board, and a separate chip capacitor mounted on the ceramic chip carrier is not required. However, this approach is limited by the thickness of the planes in the PC board and the subsequent effective capacitive area of the die due to the relative velocity the electrons can travel through the dielectric material. Additionally, this approach has the disadvantage of a large inductance path from the capacitor to the actual semiconductor die due to the thickness of the PC board. This capacitor would be ineffective for future generation devices that operate in the hundreds of megahertz (>100 MHz) range. While it is possible to fabricate relatively thin planes in PC boards to reduce inductance, this process is expensive for large boards because it requires the use of advanced processes, such as depositing dielectric materials or roll-coating them. Additionally, this process requires the use of exotic materials like interpenetrating polymers, such as Gortex or Zycon, which are not extensively used in the board fabrication industry due to their high cost. The high cost of making advanced PC boards with built-in capacitors may be prohibitive for some applications, such as desktop computers. Yet these computers utilize semiconductor devices that operate at the high frequency ranges and will require bypass capacitors to filter noisy glitches during their operation.

Thus, a need exists for an effective bypass capacitor for area array type semiconductor devices operating at high frequencies, above 100 MHz, that is also cost effective so that they can be implemented in consumer applications.

DETAILED DESCRIPTION OF A PREFERRED EMBODIMENT

The invention generally provides a PBGA semiconductor device having a built-in high frequency bypass capacitor. The device comprises an area array semiconductor die that is flip-chip mounted to a polymer carrier substrate which has the external electrical connections for the device. The polymer carrier substrate has both a stiffening portion and a thin-film portion. The thin-film portion has multiple layers of metal separated by thin-films of insulator. At least two of the metal layers are power supply layers, which are arranged such that they are adjacent and parallel conductive layers to act as capacitor plates within the thin-film portion. These built-in capacitor plates are also arranged within the thin-film portion in such a manner that they are as close to the semiconductor die as possible to minimize series inductance.

These and other features, and advantages, will be more clearly understood from the following detailed description taken in conjunction with the accompanying drawings. It is important to point out that the illustrations are not necessarily drawn to scale, and that there may be other embodiments of the present invention which are not specifically illustrated.

Figure 1:
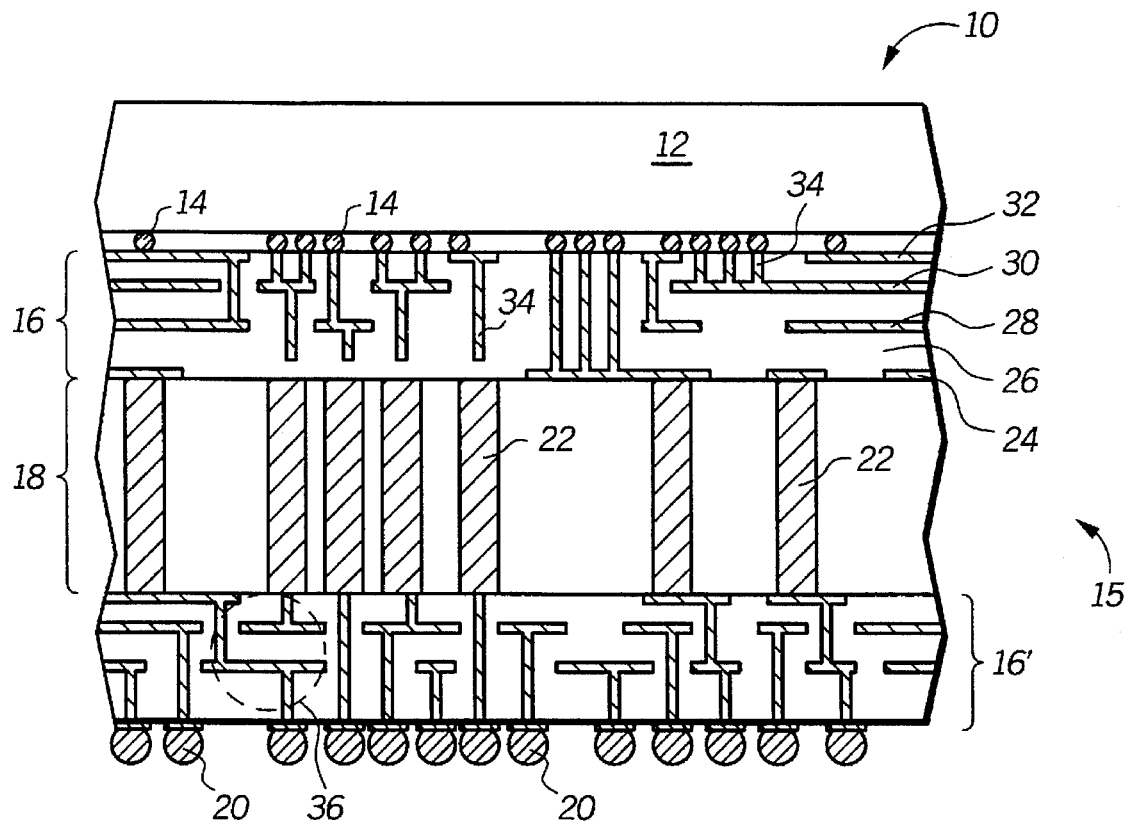
FIG. 1 illustrates, in cross-section, a portion of a semiconductor device having a built-in high frequency bypass capacitor, in a first embodiment of the invention.

FIG. 1 illustrates, in cross-section, a portion of a semiconductor device 10 having a built-in high frequency bypass capacitor, in a first embodiment of the invention. The semiconductor device 10 has a semiconductor die 12 flip-chip mounted on a carrier substrate 15 that is composed of a first thin-film portion 16, a stiffening portion 18, and a second thin-film portion 16'. The semiconductor die may be, but is not limited to, a microprocessor, a microcontroller, a digital signal processor, a dynamic random access memory (DRAM), static random access memory (SRAM), or any type of high frequency bipolar or complimentary metal oxide semiconductor (CMOS) logic or analog devices. The interconnect bumps 14 provide the electrical connections for the flip-chip connections and are typically solder, although other conductive metals, such as gold, copper, and aluminum may also be suitable. Methods for doing flip-chip or direct chip attach are known in the art. The use of flip-chip connections helps to reduce the parasitic series inductance and resistance from the die 12 to the bypass capacitor, explained subsequently, by minimizing the inductance path.

The carrier substrate 15 is a polymer-based carrier unlike the ceramic carrier in the prior art. The stiffening portion 18 of the carrier substrate is typically composed of a fire retardant epoxy-glass cloth laminate, designated as FR-4. However, the invention is in no way limited to FR-4 as the stiffener. Other stiffening materials including organics and inorganics may also be suitable, such as a polyimide-glass laminate, an epoxy-polyimide-kevlar laminate, an epoxy-graphite fiber laminate, a polyimide-fused quartz laminate, and a polyimide-kevlar laminate. Additionally, metallic materials may also be used for the stiffening portion. The stiffening portion 18 is proportionately thicker than the thin-film portion 16 and is used to provide durability and reliability for the device during handling. Additionally, the stiffening portion 18 helps to prevent warp age of the device due to thermal stress during the device's operation. The stiffening portion 18 has a plurality of large drilled vias 22 which are plated or filled for conductivity. These vias 22 may be straight vias through the thickness of the stiffening portion, or they may be offset (not shown) for routing purposes.

In addition to the stiffening portion 18, the carrier substrate 15 has a first thin-film portion 16 which overlies the stiffening portion 18. The first thin-film portion 16 is usually constructed as a laminate directly onto the stiffening portion 18 during the fabrication of the carrier substrate 15. This thin-film portion 16 is critical to the present invention because it provides the higher density conductive layers, e.g. signal, power, and ground, than is available in PC board laminate technologies, for the semiconductor die 12. Additionally, the power supply layers 28 & 30 are arranged so that they are adjacent and parallel conductive layers to act as built-in capacitor plates within the thin-film portion 16. In a minimum case, the thin-film portion 16 must have at least one signal layer, one power layer and one ground layer, the latter two layers being collectively referred to as the power supply layers. However, most advanced semiconductor devices will require more than one signal layer due to the numerous I/Os and the complexity of the routing of the signal traces within the thin-film portion. Regardless of how many signal layers may be present, it is desirable that the power supply layers be designed such that they are as close as possible to the semiconductor die 12. The shortest distance requirement is to minimize the inductance from the built-in capacitor (i.e. the pair of power supply planes) to the die because a large inductance would render the capacitor ineffective. In addition to the conductive metal layers 24, 28, 30 & 32, the first thin-film portion 16 also contains a thin insulator film 26 between every two conductive layers to maintain electrical isolation between the conductive layers. Conductive vias 34 between the various layers provide electrical continuity where needed.

Having the bypass capacitor within the carrier substrate 15 minimizes the amount of inductance of the bypass capacitor and its connecting traces. This creates an ideal situation because otherwise, a large inductance will cancel any beneficial effects provided by the capacitor, thus rendering it ineffective. For example, it is not possible in the prior art to build an effective capacitor within a ceramic carrier due to the thickness of the ceramic layers. The simplified parallel plate capacitor equation $$C = \mu_o \mu_r A / d$$

wherein

C=the value of capacitance in Farads (F)

$\mu_o$=the relative permeability of free space=$8.85 \times 10^{-12}$ F/m $\mu_r$=the relative permeability of a dielectric material=a constant A=the area of the parallel plates encompassing the dielectric ($m^2$)

d=distance between the capacitor plates (m)

dictates that the distance between the capacitor plates be as small as possible to maximize the capacitance for a given area and given dielectric constant material. However, the individual ceramic layers that can be made are significantly thicker than what is required by the capacitor and Bypass Filter equations. This is an inherent physical limitation of the ceramic fabrication process that cannot be overcome. The thin-film portion 16 of the present invention, however, utilizes a different manufacturing technology that allows the thin insulator films 26 to be much thinner than is achievable with the prior art approaches. It is also more cost effective than PC board manufacturing technologies where exotic materials have to be used to produce relatively thin boards.

The value of the capacitor should be consistent with the value of the pulse width to be filtered. This can be estimated from the simplified Bypass Filter equation (neglecting inductance)

$$P_w = 1/f_c = 2\pi RC$$

wherein $P_w$=the pulse width value in seconds $f_c$=the critical bypass frequency in cycles per second (1/sec)

$\pi$=the value of pi

R=the value of series resistance in Ohms ($\Omega$)

Figure 4:
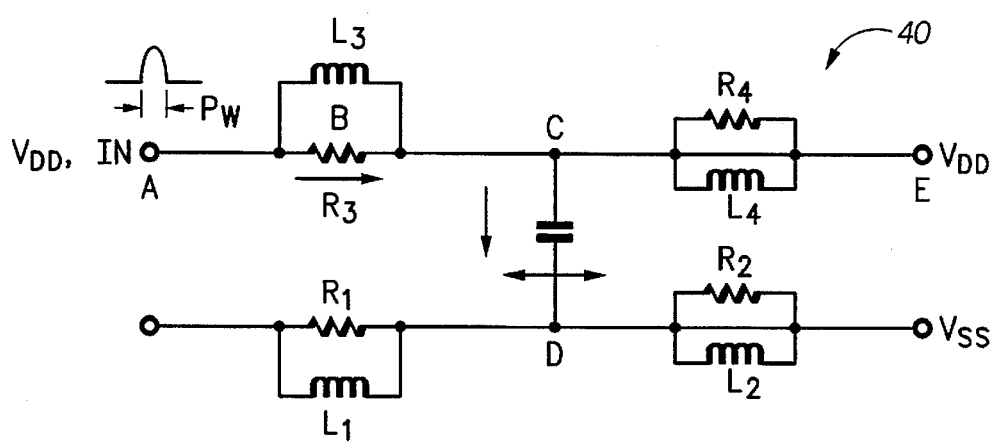
FIG. 4 is a circuit diagram of the bypass filter network of FIG. 3.

C=the value of capacitance in Farads (F)

for a given series resistance $R_3$ from the circuit of FIG. 4.

Figure 2:
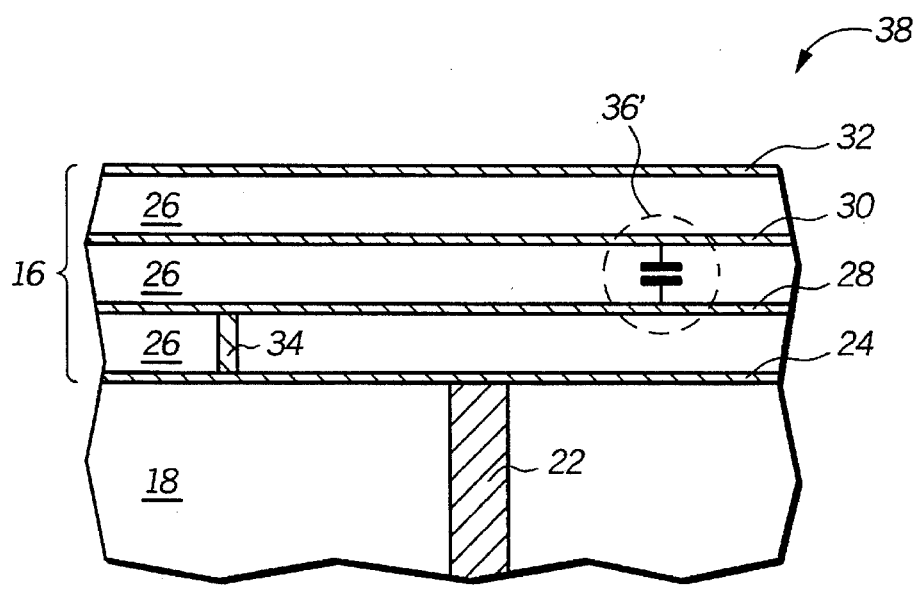
FIG. 2 illustrates, in cross-section, an enlarged view of the thin-film portion of the device of FIG. 1, having the high frequency bypass capacitor figuratively illustrated.

The fabrication of the first thin-film portion 16 is explained with reference to FIG. 2 which illustrates, in cross-section, an enlarged view 38 of the thin-film portion 16 of the device of FIG. 1. As depicted, the stiffening portion 18 is first provided with the large via 22 drilled therein. The via 22 is made conductive by either filling the via with a metal or by plating the via. Then a first metal layer 24 is deposited overlying the top surface of the stiffening portion. This metal layer 24 is typically copper, although the use of other metals is not precluded. Metal layer 24 is then patterned, such as with a photolithographic method, to form signal traces for the device. After the first metal layer is patterned, a thin insulator film 26 is deposited overlying the metal layer 24. Alternatively, the thin insulator film may also be roll coated or otherwise affixed to the metal layer. This thin insulator film 26 is an epoxy resin in a preferred embodiment of the invention, but is not limited to such a resin. The thickness of this thin insulator film 26 is approximately 45 µm in the case of an epoxy resin, but the thickness may be varied depending on the relative permeability of the specific material to yield the required capacitance per the capacitor equation.

Once the thin insulator film 26 is formed onto the stiffening portion 18, the film 26 is patterned to form the vias 34 in the required locations per a specific design. Although only one via 34 is shown in FIG. 2, it should be understood that there more than one via can, and probably are, formed in the thin insulator film 26. The vias 34 may be either etched or formed through photolithography depending on the chemistry of the insulator film material, but they are not drilled vias. Comparatively speaking, the vias 34 are much smaller than the drilled vias 22 so that inductance is minimized. The vias 34 are plated with a conductor such as copper. Then a second metal layer 28 is deposited overlying the thin insulator film 26. This metal layer 28 is designated as a power supply layer, either power or ground, in this embodiment of the invention. Again, the metal layer 28 is patterned per the requisite design. Then another thin insulator film 26 is formed overlying the metal layer 28. The patterning for vias and plating processes are then repeated. Then a third metal layer 30 is deposited overlying the top surface of the thin insulator film 26 and then patterned. This metal layer 30 is also designated as a power supply layer, either power or ground depending on what metal layer 28 was intended to be. It is critical that the pair of power supply layers be adjacent to each other since each power supply layer serves as one capacitor plate. Thus, the built-in bypass capacitor, formed by the two power supply layers, is representatively shown as capacitor 36'. Overlying the power supply layer 30 is another thin insulator film 26 and another metal layer 32. The top metal layer 32 is typically a signal layer upon which the interconnect bumps 14 of FIG. 1 are attached.

Although not specifically illustrated, it is possible to form stacked bypass capacitors in the thin-film portion by forming several pairings of power supply planes to act as parallel capacitor plates. For example, metal layer 32 may alternatively be designated as a power supply plane such that there are now two pairs of adjacent and parallel conductive planes acting as built-in bypass capacitors, e.g. the capacitor 36' formed by planes 28 & 30, and another capacitor formed by planes 30 & 32. Of course, more metal layers acting as signal layers may be added in the stack as required. Stacking the capacitors in this manner increases the overall thickness of the thin-film portion. Thus, the number of capacitors built in this manner is constrained by the overall thickness limitation on the device for a particular application. Additionally, the addition of each extra metal layer requires vias to maintain electrical connectivity and the increase in the conductive path also increases inductance and resistance in the device. Thus, an optimization may be required between the addition of capacitors in the stack and the loss of effectiveness of those additional capacitors due to the increase in inductance.

Returning to FIG. 1, the device 10 also has a second thin-film portion 16' which is attached to the underside of the stiffening portion 18, such that the two thin-film portions sandwich the stiffening portion 18 between them. This second thin-film portion 16' is optional in practicing the present invention but it may be desirable to have this second thin-film portion for purposes of controlling warpage of the assembled device. The second thin-film portion preferably has as many layers of conductors and insulators as the first thin-film portion 16 to provide mechanical stress force balance. The fabrication of the second thin-film portion is substantially the same as that for the first thin-film portion in that successive layers are deposited and patterned according a particular design requirement. It should be noted that the pairs of adjacent and parallel power supply planes in the second thin-film portion can also be used to form built-in bypass capacitors for the device, as highlighted in the encircled area 36.

The outermost conductive layer 37 on the second thin-film portion 16' serves as solder pads for the connection of solder balls 20 which are the external electrical connections for the device. These solder balls 20 are the next-level interconnects and are used to mount the device to a PC board (not shown). The solder balls can be either collapsible or non-collapsible depending on the composition of the solder used. If collapsible solder balls are desired, then a eutectic solder composition of approximately 63% lead and 37% tin (63-37) may be used to form the solder balls. If non-collapsible solder balls are desired, then a solder composition of approximately 90% lead and 10% tin (90-10) could be used to form the solder balls. Eutectic solder has a melting point of approximately 183° C., while 90-10 solder has a melting temperature of around 300° C. The 63-37 balls can be melted in contact with the chip carrier material which can tolerate the reflow temperatures required for the appropriate times. The collapsible eutectic (63-37) solder balls are well known in the art for PBGA packages to provide a highly reliable connection to a PC board because they can be melted and collapsed during the second-level board assembly process to make the connection from the PBGA and the PC board. For non-collapsible connections the bulk of solder balls would not melt during reflow (board mount) such that the solder balls keep their substantially rounded shape after board mounting. It should be understood that the invention is not limited to these attachment techniques at either the chip or package level.

Figure 3:
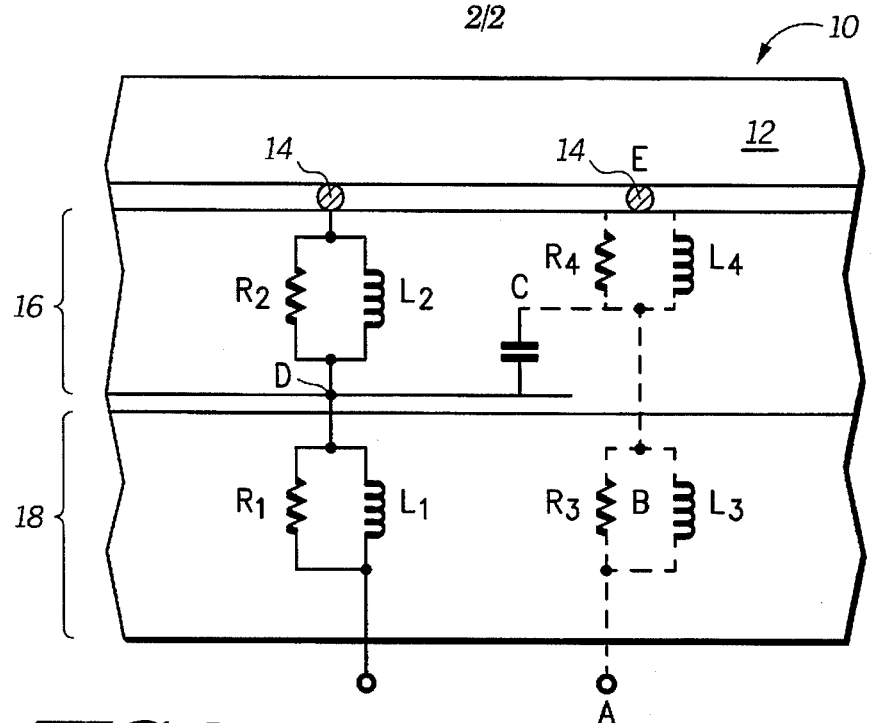
FIG. 3 illustrates a simplified network circuit diagram representation of the device of FIG. 1 through the different layers of the device.

FIG. 3 illustrates a simplified network circuit diagram representation of the first thin film portion 16 and the stiffening portion 18 of the PBGA device 10 of FIG. 1, concerning the parasitic series resistances and inductances associated with the device construction. A primary goal in building an effective bypass capacitor is to minimize the series inductances $L_4$ and $L_2$ between the bypass capacitor C and the die 12. Thus, building the bypass capacitor C in the thin film region 16 reduces the length of the inductance path and, in effect, the value of the series inductance.

In FIG. 3, $L_4$ and $R_4$ represent the lump sum parasitic series resistance and inductance from one plate of the bypass capacitor C to the die 12 at connection E shown as interconnect bumps 14; and $L_2$ and $R_2$ show the lump sum parasitic series resistance and inductance from the other plate of the bypass capacitor C to the die 12 at point D. $L_3$, $R_3$, $L_4$ and $R_4$ show the lump sum parasitic series resistance and inductance from one plate of the bypass capacitor C to point A (representing a solder ball 20 in FIG. 1) through the stiffening portion 18. This network circuit of the circuit diagram representation of the thin film portions 16 and the stiffening portion 18 is illustrated in circuit form in FIG. 4.

FIG. 4 illustrates a simplified Bypass Filter circuit consistent with what the die 12 from FIG. 3 would observe with the built-in bypass capacitor between points C and D. At point A where external chip direct current (DC) voltage $V_{DD}$ is applied to the device, the glitch pulse $P_w$ is also applied to the circuit in FIG. 4. The arrows indicate the direction of the glitch pulse $P_w$, in effect, bypassing the die 12 (from FIG. 3) at point E, and returning to ground or $V_{SS}$ at point D. $L_4$ and $L_2$ are typically in the sub-nano Henry range of inductance due to short lengths. $L_3$ and $L_1$ are typically in the nano Henry range due to the highly conductive material used in the via construction and the large diameter vias associated with stiffening portion 18 (from FIG. 3) during the construction of this PBGA device.

Figure 5:
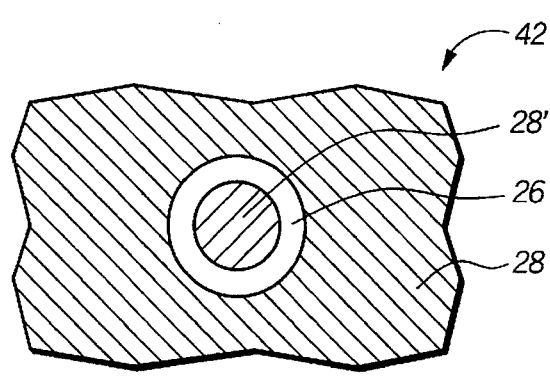
FIG. 5 illustrates, in a top view, an enlarged portion of a power supply layer that has been patterned to form isolated power supply planes, in accordance with an embodiment of the invention.

FIG. 5 illustrates, in a top view, an enlarged portion 42 of a power supply layer 28 that has been patterned to form an isolated power supply plane 28', in accordance with an embodiment of the invention. Keeping in mind that during the fabrication process of the thin-film portion, the different layers of metal are patterned according to the design requirements of a particular semiconductor die. Accordingly, parts of the power supply layer 28' may be isolated from the remaining metal layer 28 in appropriate places such that a small termination capacitor may be formed which can be tied to the end of a signal trace. This small capacitor would effectively filter noise for a particular signal pulse because it is placed in close proximity to the signal line so that the resistance and inductance are low enough so as to not overcome the benefits of the capacitor. This feature may be useful for a clock signal which may operate at very high frequencies, e.g.. above 100 MHz, for future generation devices.

The foregoing description and illustrations contained herein demonstrate many of the advantages associated with the present invention. In particular, it has been revealed that an effective high frequency bypass capacitor can be built in the thin film layers of a PBGA device that minimizes the parasitic series inductances and resistances detrimental to effective bypass capacitance. Moreover, it is shown that this bypass capacitance can be obtained in the device itself during the carrier substrate construction, therefore eliminating the need to add external bypass capacitors. Yet another advantage is that the present invention simplifies the number of components a manufacturer has to apply to a finished PC board, therefore reducing cost due to components and assembly yield loss.

Thus it is apparent that there has been provided, in accordance with the invention, a semiconductor device having a built-in high frequency bypass capacitor and a method for making the same that fully meet the need and advantages set forth previously. Although the invention has been described and illustrated with reference to specific embodiments thereof, it is not intended that the invention be limited to these illustrative embodiments. Those skilled in the art will recognize that modifications and variations can be made without departing from the spirit of the invention. For example, an underfill of the flip-chip connection during the die to package assembly may be added. Additionally, the tin and lead solder balls may be substituted with conductive polymer balls. Furthermore, solder columns or plated polymer columns instead of solder balls can be used. In addition, any type of dielectric between the plates of the bypass capacitors may be used in the package construction that differs from the insulator used between the conductive signal layer traces as well as any highly conductive materials may be substituted for the conductive layers in the PBGA package. Therefore, it is intended that this invention encompasses all such variations and modifications falling within the scope of the appended claims.

We claim:

1. A semiconductor device comprising:
   a thin-film substrate having a plurality of substantially parallel conductive layers, wherein every two adjacent conductive layers of the plurality of conductive layers are separated by an insulative layer and wherein the plurality of conductive layers comprises:
   a signal layer;
   a ground layer; and
   a power layer, wherein the ground layer and the power layer are adjacent conductive layers to form a capacitor region within the thin-film substrate to reduce noise in the semiconductor device;
   a semiconductor die which is flip-chip mounted to the thin-film substrate;
   a stiffening substrate that is thicker than the thin-film substrate, the stiffening substrate having a surface that is in intimate contact with and physically bonded to the thin-film substrate, the stiffening substrate having a plurality of conductive vias to maintain electrical contact with the semiconductor die that is mounted to the thin-film substrate; and
   a plurality of external electrical connections for the semiconductor device, the plurality of external electrical connections being electrically connected through the plurality of conductive vias in the stiffening substrate.

2. The semiconductor device of claim 1, further comprising:
   a second thin-film substrate having a second plurality of conductive layers, wherein every two adjacent conductive, layers of the second plurality of conductive layers are separated by a second insulative layer and wherein the second plurality of conductive layers comprises:
   a second ground layer; and
   a second power layer, wherein the second ground layer and the second power layer are adjacent and parallel conductive layers to form a second capacitor region within the second thin-film substrate;
   wherein the second thin-film substrate is in intimate contact with and physically bonded to a second surface of the stiffening substrate such that the stiffening substrate is sandwiched between the first and second thin-film substrates and wherein the plurality of external electrical connections is physically attached to the second thin-film substrate.

3. The semiconductor device of claim 1, wherein the insulative layer is at most 45 μm thick.

4. The semiconductor device of claim 1, wherein the insulative layer is composed of an epoxy resin.

5. The semiconductor device of claim 1, wherein the stiffening substrate is composed of a epoxy-glass cloth material.

6. The semiconductor device of claim 1, wherein the semiconductor device operates at a frequency of at least 100 MHz.

7. The semiconductor device of claim 1, wherein the plurality of conductive layers is composed of copper.

8. The semiconductor device of claim 1, wherein the capacitor region in the thin-film substrate is located below the semiconductor die and wherein only 1 signal layer separates the semiconductor die from the capacitor region.

9. The semiconductor device of claim 1, wherein the ground layer is patterned so as to comprise isolated ground planes in the ground layer.

10. A high frequency semiconductor device, comprising:
- a thin-film substrate having a plurality of substantially parallel conductive layers, wherein every two adjacent conductive layers of the plurality of conductive layers are separated by an insulative layer and wherein the plurality of conductive layers comprises:
  - at least one signal layer; and
  - at least two power supply layers, which are adjacent and parallel conductive layers, to form a capacitor region within the thin-film substrate to reduce noise in the high frequency semiconductor device;
- a semiconductor die which is flip-chip mounted to the thin-film substrate;
- a stiffening substrate that is thicker than the thin-film substrate, the stiffening substrate having a surface that is in intimate contact with and physically bonded to the thin-film substrate, the stiffening substrate having a plurality of conductive vias to maintain electrical contact with the semiconductor die that is mounted to the thin-film substrate; and
- a plurality of solder balls serving as external electrical connections for the semiconductor device, the plurality of solder balls being electrically connected to the plurality of conductive vias in the stiffening substrate.

11. The semiconductor device of claim 10, wherein the plurality of solder balls is composed of a material containing approximately 90% lead and 10% tin.

12. The semiconductor device of claim 10, wherein the plurality of solder balls is composed of a material containing approximately 63% lead and 37% tin.

13. The semiconductor device of claim 10, further comprising a termination capacitor connected to the at least one signal layer, wherein the termination capacitor is composed of two adjacent and parallel power supply planes which are isolated from the at least two power supply layers.

14. The semiconductor device of claim 10, further comprising:
- a second thin-film substrate having a second plurality of conductive layers, wherein every two adjacent conductive layers of the second plurality of conductive layers are separated by a second insulative layer and wherein the second plurality of conductive layers comprises at least two power supply layers, which are adjacent and parallel conductive layers to form a second capacitor region within the second thin-film substrate;
- wherein the second thin-film substrate is in intimate contact with and physically bonded to a second surface of the stiffening substrate such that the stiffening substrate is sandwiched between the first and second thin-film substrates and wherein the plurality of solder balls is physically attached to the second thin-film substrate.

* * * * *